US 8,261,165 B2

(12) United States Patent
Mutchnik et al.

(10) Patent No.: US 8,261,165 B2
(45) Date of Patent: Sep. 4, 2012

(54) MULTI-SYNDROME ERROR CORRECTION CIRCUIT

(75) Inventors: Sharon Mutchnik, San Jose, CA (US); Boris Liubovitch, Santa Clara, CA (US)

(73) Assignee: Silicon Laboratories Inc., Austin, TX (US)

( * ) Notice: Subject to any disclaimer, the term of this patent is extended or adjusted under 35 U.S.C. 154(b) by 964 days.

(21) Appl. No.: 12/271,579

(22) Filed: Nov. 14, 2008

(65) Prior Publication Data

US 2010/0125776 A1    May 20, 2010

(51) Int. Cl.
 *H03M 13/00*    (2006.01)
(52) U.S. Cl. .................... 714/785; 714/795; 714/758
(58) Field of Classification Search .................. 714/785, 714/780, 795, 758, 755, 786, 784, 776, 726, 714/781

See application file for complete search history.

(56) References Cited

U.S. PATENT DOCUMENTS

| 4,276,647 | A |   | 6/1981  | Thacker et al. ................. 371/40    |
|-----------|---|---|---------|-------------------------------------------|
| 4,404,674 | A |   | 9/1983  | Rhodes ........................... 371/43  |
| 4,644,543 | A |   | 2/1987  | Davis, Jr. ....................... 371/37  |
| 4,649,543 | A |   | 3/1987  | Levine ........................... 371/41  |
| 5,805,614 | A |   | 9/1998  | Norris ......................... 371/37.02 |
| 5,841,378 | A | * | 11/1998 | Klayman et al. ................ 341/61     |
| 5,930,273 | A |   | 7/1999  | Mukojima ................. 371/37.02       |
| 6,289,000 | B1|   | 9/2001  | Yonge, III ..................... 370/203   |
| 6,347,122 | B1|   | 2/2002  | Chen et al. ..................... 375/262  |
| 6,374,387 | B1|   | 4/2002  | Van den Berghe ............ 714/790        |
| 6,675,348 | B1|   | 1/2004  | Hammons, Jr. et al. ...... 714/790         |
| 6,687,315 | B2| * | 2/2004  | Keevill et al. ................. 375/341   |
| 6,694,146 | B1|   | 2/2004  | Hardin et al. .................. 455/515   |
| 6,728,925 | B2|   | 4/2004  | Ishiwatari et al. ............. 714/777    |
| 6,768,778 | B1|   | 7/2004  | Chen et al. ..................... 375/262  |
| 6,823,470 | B2|   | 11/2004 | Smith et al. ....................... 714/4 |
| 6,851,086 | B2| * | 2/2005  | Szymanski ................... 714/781      |
| 6,950,976 | B1|   | 9/2005  | Garrabrant et al. ........... 714/794      |
| 7,027,532 | B2|   | 4/2006  | Lauer ............................ 375/341 |
| 7,284,184 | B2|   | 10/2007 | Gallezot et al. ............... 714/762    |
| 7,346,819 | B2| * | 3/2008  | Bansal et al. ................. 714/726    |
| 7,409,001 | B2|   | 8/2008  | Ionescu et al. ................ 375/267    |
| 7,610,544 | B2| * | 10/2009 | Guo ............................. 714/776  |
| 7,652,999 | B2| * | 1/2010  | Liu et al. ....................... 370/241 |
| 7,849,384 | B2| * | 12/2010 | Costa et al. ................... 714/776   |
| 2002/0016933 | A1 |   | 2/2002 | Smith et al. ........................ 714/4 |
| 2003/0061562 | A1 |   | 3/2003 | Ishiwatari et al. ............ 714/777     |
| 2003/0118133 | A1 |   | 6/2003 | Lauer ............................ 375/344 |
| 2004/0193997 | A1 |   | 9/2004 | Gallezot et al. ............... 714/758    |
| 2006/0029145 | A1 |   | 2/2006 | Rajagopal et al. ............ 375/265      |
| 2006/0034381 | A1 |   | 2/2006 | Ionescu et al. ................ 375/267    |
| 2006/0159195 | A1 |   | 7/2006 | Ionescu et al. ................ 375/267    |
| 2007/0157064 | A1 |   | 7/2007 | Falik et al. .................... 714/755  |
| 2008/0109707 | A1 |   | 5/2008 | Dell et al. ..................... 714/776  |
| 2008/0172589 | A1 |   | 7/2008 | Gallezot et al. ............... 714/746    |

FOREIGN PATENT DOCUMENTS

WO    WO 2004/098067    11/2004

* cited by examiner

*Primary Examiner* — Fritz Alphonse
(74) *Attorney, Agent, or Firm* — Cesari & Reed LLP; R. Michael Reed

(57) ABSTRACT

In a particular embodiment, a forward error correction (FEC) decoder is disclosed that includes an input responsive to a communication channel to receive sampled bits from a continuous bit stream. The circuit device further includes a logic circuit to alternately provide sets of the received sampled bits from the continuous bit stream to one of a first syndrome generator and a second syndrome generator to correct errors in the sets of sampled bits to produce a decoded output related to the continuous bit stream.

21 Claims, 5 Drawing Sheets

MULTI-SYNDROME ERROR CORRECTION CIRCUIT

FIELD

The present disclosure is generally related to a multi-syndrome error correction circuit, and more particularly but without limitation to error correction circuits that include at least two syndrome generators for correction of continuous bit streams.

BACKGROUND

Receiver circuits typically include error correction circuitry to correct bit errors. A Hamming code is one type of error correction code that is used for forward error correction, which is a technique where the transmitting system includes some number of redundant bits in the transmission payload (data field) of a block or set of data. The receiving device can utilize the redundant bits to detect and correct transmission errors and can often avoid retransmission of the data. Conventional systems, such as Bluetooth® systems that use a forward error correction (FEC) algorithm, may utilize a simple FEC decoder, which may be able to fix a single transmission error within a data set, but may not be able to correct multiple errors within a payload. Such FEC decoders operate serially, receiving data in a first sequence of clock cycles, and then outputting corrected data in a second sequence of clock cycles. To decode a continuous bit stream, there are usually two sets of decoders or data may be lost. Alternatively, the FEC decoder may need gaps in the received data in order to correct errors within the data and output the retrieved information.

SUMMARY

In a particular embodiment, a forward error correction (FEC) decoder is disclosed that includes an input responsive to a communication channel to receive sampled bits from a continuous bit stream. The circuit device further includes a logic circuit to alternately provide sets of the received sampled bits from the continuous bit stream to one of a first syndrome generator and a second syndrome generator to correct errors in the sets of sampled bits to produce a decoded output related to the continuous bit stream.

In another particular embodiment, a circuit device is disclosed that includes a shifter circuit responsive to a communication channel to receive sampled bits related to a continuous bit stream and to shift the sampled bits serially with each clock cycle. The circuit device further includes a first syndrome generator to correct at least one error within a first set of sampled bits to produce a first corrected set of bits and includes a second syndrome generator to correct at least one error within a second set of sampled bits to produce a second corrected set of bits. The circuit device also includes a logic circuit adapted to control the shifter circuit to selectively shift the sampled bits to one of the first syndrome generator or the second syndrome generator to produce to a corrected output related to the continuous bit stream.

DETAILED DESCRIPTION OF ILLUSTRATIVE EMBODIMENTS

Short range radio frequency communications have become increasingly popular within consumer electronics, including wireless telephones. One example of a widely used short range radio frequency communication protocol is called Bluetooth®, which is a popular radio transceiver standard for communication devices. The Bluetooth® physical layer employs Gaussian frequency-shift keying (GFSK) and provides for simple forward-error correction (FEC) schemes. In particular, a data payload of data medium (DM)-rate packet types is protected by the rate-⅔ expurgated (15, 10) binary Hamming code. The (15,10) Hamming code decodes data sets of fifteen bits, which data sets include ten data bits and five error-correcting bits. It is typically assumed that the bit errors at the FEC decoder input are independent and that at most two errors per code word can be corrected with the expurgated (15,10) Hamming code.

However, the error-gap distribution at the input of the FEC decoder reveals that the communications channel between an FEC encoder output of the transmitter and the FEC decoder input of the receiver is not memory-less, but that burst errors of length two (i.e., double adjacent errors) can occur with high probability. Making use of the fact that the expurgated (15, 10) Hamming code is a single-error-correcting double-adjacent-error-correcting (SEC-DAEC) code, the FEC decoder can be used to correct the high probability double adjacent errors with no additional performance costs.

In a particular embodiment, the SEC-DAEC code functionality can be employed within a (15,10) FEC decoder that has first and second syndrome generators that operate independently to correct errors in sampled bits from a continuous bit stream and to output the corrected bits while the other syndrome generator is correcting errors in a next set of sampled bits. The FEC decoder further includes an FEC shifter that operates as a buffer to store the sampled bits continuously and to alternately provide the sampled bits to one of the first syndrome generator or second syndrome generator. In a particular example, the FEC decoder can include logic that coordinates the workloads of the first and second syndrome generators such that, during receipt of a continuous bit stream, one syndrome generates one set of correction bits, while the other uses its correction bits to fix the output data.

Figure 1:
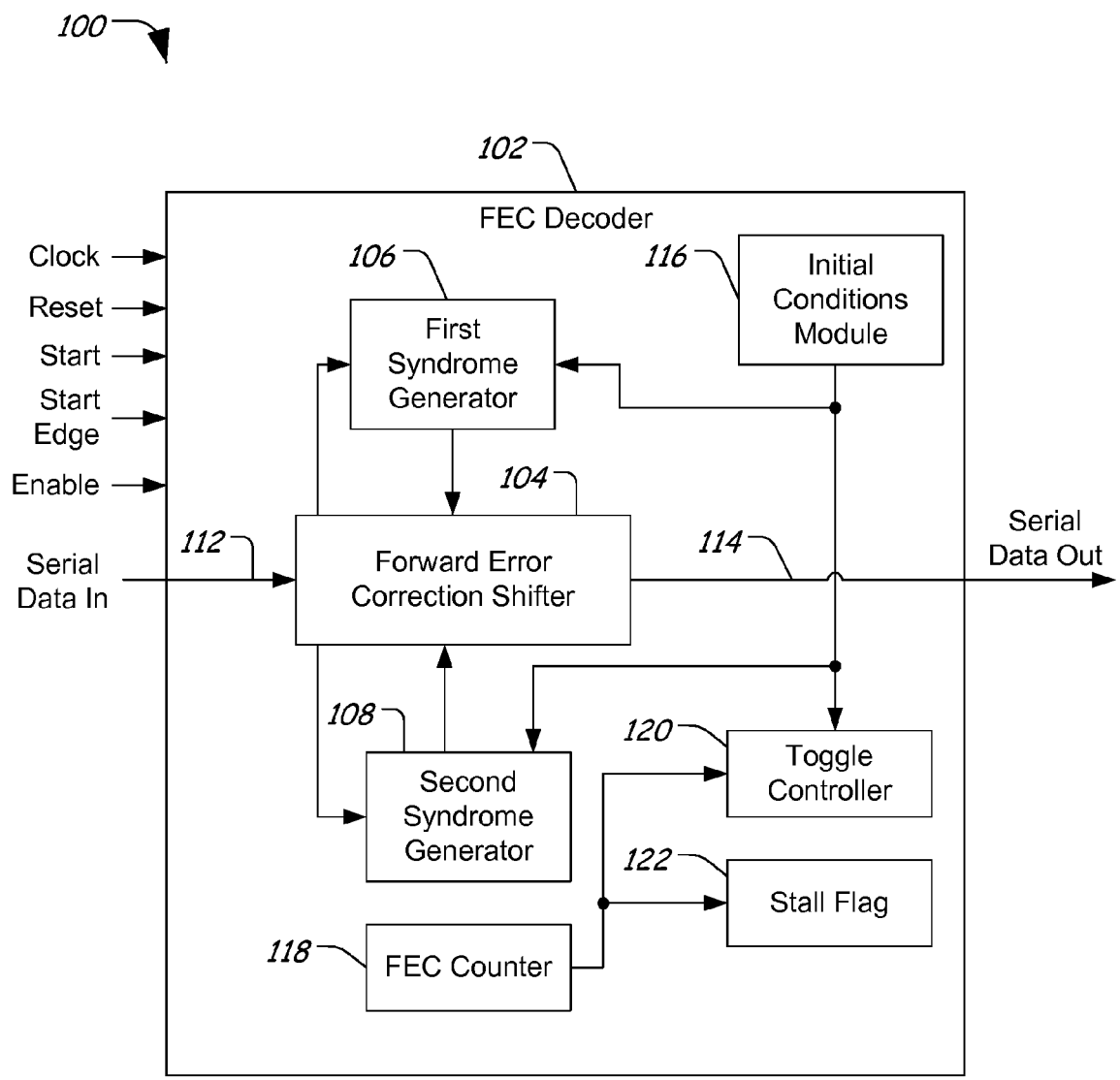
FIG. 1 is block diagram of a particular illustrative embodiment of a system including a forward error correction (FEC) decoder having a pair of syndrome generators that cooperate to perform error correction on sampled bits of a continuous bit stream.

FIG. 1 is block diagram of a particular illustrative embodiment of a system 100 including a forward error correction (FEC) decoder 102 having a pair of syndrome generators, such as first and second syndrome generators 106 and 108 that cooperate to perform error correction on sampled bits of a continuous bit stream using FEC information within the continuous bit stream. The FEC decoder 102 includes an FEC shifter 104 that is adapted to temporarily store (buffer) the sampled bits. The FEC shifter 104 is coupled to an input 112 to receive the sampled bits and to the first and second syndrome generators 106 and 108. The FEC shifter 104 is also coupled to an output 114 to provide a corrected output related to the sampled bits. The FEC decoder 102 further includes an initial conditions module 116 to set the initial conditions for the first and second syndrome generators 106 and 108 and to set initial conditions for a toggle controller 120. For example, the initial conditions module 116 can apply zeros or otherwise reset flop circuits associated with the first and second syndrome generators 106 and 108 and can configure the FEC counter 118 and the toggle controller 120 to a starting condition. Further, the initial conditions module 116 can reset a stall flag module 122, which may provide an indication to a host system that data at the output 114 is invalid. The FEC decoder 102 also includes an FEC counter 118 that is coupled to the toggle controller 120 and to the stall flag module 122. The toggle controller 120 may be coupled to the FEC shifter 104 to control when the FEC shifter 104 shifts data to the first syndrome generator 106 or to the second syndrome generator 108.

The FEC decoder 102 is adapted to receive a clock signal, an optional reset signal, a start signal, a start edge signal, and an enable signal. The clock signal is used by the FEC decoder 102 to shift data bits and is counted by the FEC counter circuit 118. In a particular embodiment, the reset signal can be used to reset the entire FEC decoder 102 to initial conditions. In an alternative embodiment, the reset signal can be used to reset initial conditions of the first and second syndrome generators 106 and 108, the FEC counter 118, the stall flag 122, and the toggle controller 120. In this particular example, the reset signal can be used to restart/restore the initial conditions without the need of a reset of the entire FEC decoder 102 and without the need for the start signal to change from logic high, to logic low, and back to logic high again. In a particular example, this particular reset signal can be provided directly to the initial conditions module 116 to trigger a reset operation. The start signal is applied to the FEC decoder 102 begin clocking sampled bits. Further, the start edge signal can be selectively applied to define whether the bits are clocked on the rising or falling edge of the clock signal. Further, the enable signal can be received to activate the FEC decoder 102, allowing the FEC decoder 102 to receive serial data and shift it into the FEC shifter 104 with each clock pulse of the clock signal.

In a particular embodiment, the forward error correction (FEC) shifter 104 is adapted to any number of sampled bits related to a continuous bit stream. The FEC counter 118 is adapted to count clock cycles and to control the FEC shifter 104 to shift received bits to the first syndrome generator 106 during a period including a number of clock cycles and to shift received bits to the second syndrome generator 108 during a next period including the number of clock cycles. In a particular example, the FEC counter circuit 118 is adapted to count clock cycles and to trigger the toggle controller 120 to toggle the FEC shifter 104 from one syndrome generator to the other each time the FEC counter circuit 118 resets (turns over). For example, the FEC counter circuit 118 is adapted to count fifteen clock cycles, the toggle controller 120 changes its toggle output every fifteen clock cycles, causing the FEC shifter 104 to shift received data bits to a different syndrome generator (i.e., from the first syndrome generator 106 to the second syndrome generator 108, or vice versa).

In a particular embodiment, the continuous bit stream can include FEC information associated with a (15, 10) Hamming code, and the counter can be adapted to count fifteen clock cycles before toggling, such that the fifteen bit payload can be received and shifted to the first syndrome generator 106 to correct single errors and double adjacent errors while the next sequence of bits is shifted into the second syndrome generator 108. The FEC shifter 104 receives a sampled data bit with each clock cycle. After the fifteen bits of input data have been received, during a next fifteen clock cycles, the first syndrome generator 106 cooperates with the FEC shifter 104 to output corrected data. At the same time, the second syndrome generator 108 receives a next fifteen sampled bits. After this fifteen clock cycles, during a next fifteen clock cycles the second syndrome generator 108 cooperates with the FEC shifter 104 to output the corrected data while the first syndrome generator 106 receives a next fifteen sampled bits.

The FEC shifter 104 stores the incoming data and serves as a data buffer. The first and second syndrome generators 106 and 108 are alternately employed to correct data errors within the received bits. In a particular example, while the first syndrome generator 106 is being "charged" and formed with incoming data available on one side of the FEC shifter 104, the other side of the FEC shifter 104 is outputting data and the second syndrome generator 108 is correcting the data. Both ends of the FEC shifter 104 are used at all times (after the first fifteen bits have been processed, i.e., after initial conditions). In a particular illustrative embodiment, the data bits are alternately shifted into the first and second syndrome generators 106 and 108 using a logic circuit, such as a single flip-flop circuit. By alternately correcting errors using the first and the second syndrome generators 106 and 108, sampled bits from a continuous bit stream can be received without requiring stalls or gaps in the receiving process.

In a particular embodiment, forward error correction (FEC) coding used with the bit stream is a (15, 10) Hamming code, which has a ⅔ rate, such that out of every fifteen data bits, ten corrected data bits are output. The FEC decoder 102 also includes a stall mechanism (such as the stall flag 122) at the output, which is accessible to a host system to determine when the decoder output is available for sampling by the host system. In a particular embodiment, the stall flag 122 can be a register that includes multiple bits to indicate when valid data is available for sampling and/or to indicate when the corrected data is corrupt. In some instances, errors in the sampled data may not be correctable and may require retransmission (or may be dropped, such as dropped audio data in an audio communication channel).

In a particular embodiment, the FEC decoder 102 can be constructed using thirty-two flip-flops. In contrast, a double FEC decoder implementation would require at least fifteen more flip-flops more if it is efficiently constructed by sharing the FEC counter 118, and fully redundant decoder implementation would use twenty or more additional flip-flop circuits to perform the same function. In a particular example, the stall flag 122 can include one or more bits to indicate when the data is valid and ready to be sampled by the host or to indicate when the data is corrupt and requires retransmission.

Figure 2:
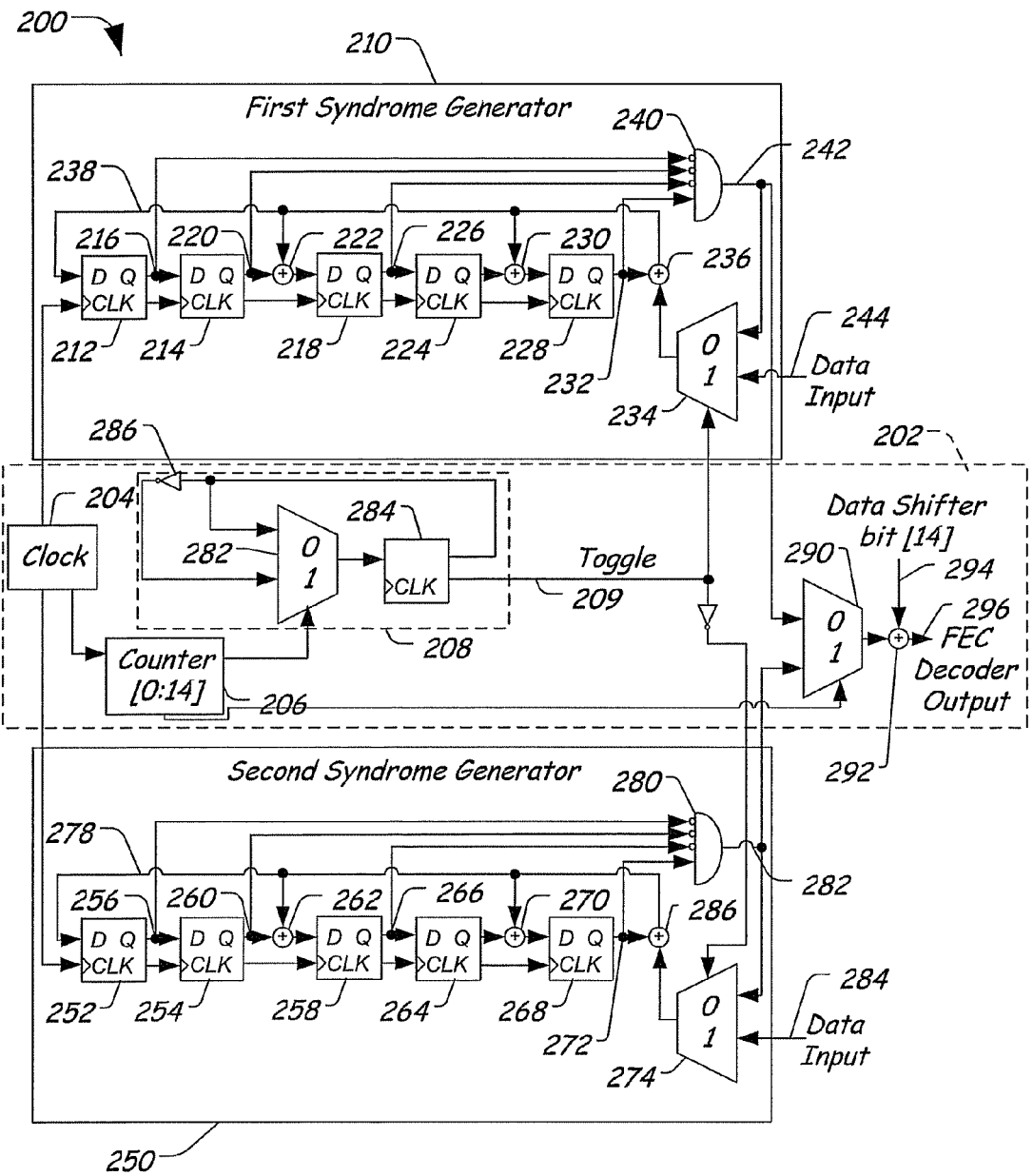
FIG. 2 is a block diagram of a second particular illustrative embodiment of a system including an FEC decoder having a pair of syndrome generators that cooperate to perform error correction on sampled bits of a continuous bit stream.

FIG. 2 is a block diagram of a second particular illustrative embodiment of a system 200 including an FEC decoder having a pair of syndrome generators, including first and second syndrome generators 210 and 250, that cooperate to perform error correction on sampled bits of a continuous bit stream. The system 200 further includes logic circuitry 202 that is adapted to receive sampled bits from a continuous bit stream and to selectively shift the sampled bits to one of the first or second syndrome generators 210 and 250. In a particular embodiment, the logic circuitry 202 includes a clock circuit 204 adapted to produce a clock signal. In another particular embodiment, the logic circuit 202 may receive a clock signal from a clock source that is separate from the logic circuit 202. Further, the logic circuit 202 includes a counter circuit 206 adapted to count clock signals received from a clock source, such as the clock circuit 204. Additionally, the logic circuit 202 includes a toggle circuit 208, which is coupled to the counter circuit 206 and which includes a toggle output 209 that is coupled to the multiplexing circuits 234 and 274 of the first and second syndrome generators 210 and 250. The toggle output 209 is also coupled to the output multiplexing circuit 290 to select whether to provide a value at an output node 242 or a value at an output node 282 as corrected data at an output 296.

The first syndrome generator 210 includes a first flip-flop circuit 212 that includes a data input coupled to a feedback loop 238 and a clock input coupled to the clock source 204. The first flip-flop circuit 212 includes a clock output coupled to a clock input of a second flip-flop circuit 214 and a data output coupled to a node 216. The node 216 is coupled to an inverted input of a logic circuit 240 and to a data input of the second flip-flop circuit 214. The second flip-flop circuit 214 includes a clock output coupled to a clock input of a third flip-flop circuit 218. The second flip-flop circuit 214 further includes a data output coupled to a node 220. The node 220 is coupled to a second inverted input of the logic circuit 240 and to a summing node 222, which receives data from the feedback loop 238 and from the node 220 and which provides data to a data input of the third flip-flop circuit 218. The third flip-flop circuit 218 includes a clock output coupled to a clock input of a fourth flip-flop circuit 224.

Further, the third flip-flop circuit 218 includes a data output coupled to a node 226, which is coupled to a third inverted input of the logic circuit 240 to a data input of the fourth flip-flop circuit 224. The fourth flip-flop circuit 224 includes a clock output coupled to a clock input of a fifth flip-flop circuit 228 and includes a data output coupled to a summing node 230, which is coupled to the feedback loop 238 and which provides data to a data input of the fifth flip-flop circuit 228. The fifth flip-flop circuit 228 includes a data output coupled to a node 232 that is coupled to a fourth input of the logic circuit 240 and to a summing node 236, which receives an input from a multiplexing circuit 234 and which provides data to the feedback loop 238. The logic circuit 240 has an output coupled to a node 242, which in turn is coupled to the multiplexing circuit 234 and an output multiplexing circuit 290 that is part of the logic circuit 202. Further, the multiplexing circuit 234 is coupled to a data input 244. In a particular embodiment, the multiplexing circuit 234 is adapted to multiplex data at an output node 242 and the data input 244 based on a toggle signal 209 received via the toggle circuit 208.

The toggle circuit 208 includes a multiplexing circuit 282 that has an output coupled to a flip-flop circuit 284, which includes an output that is fed back to a first input of the multiplexing circuit 282 and that is inverted by an inverter circuit 286 and provided to a second input of the multiplexing circuit 282. The multiplexing circuit 282 is controlled by an output of the counter circuit 206 to selectively output one of the output of the flip-flop circuit 284 or an inverted version of the output signal. The flip-flop 284 may be clocked by the counter circuit 206 or by the clock 204, depending on the implementation. The toggle circuit 208 also provides a toggle output 209 that is coupled to the multiplexing circuit 234 and via an inverter to the multiplexing circuit 284 of the first and second syndrome generators 210 and 250, respectively.

The second syndrome generator 250 includes a first flip-flop circuit 252 that includes a data input coupled to a feedback loop 278 and a clock input coupled to the clock source 204. The first flip-flop circuit 252 includes a clock output coupled to a clock input of a second flip-flop circuit 254 and a data output coupled to a node 256. The node 256 is coupled to an inverted input of a logic circuit 280 and to a data input of the second flip-flop circuit 254. The second flip-flop circuit 254 includes a clock output coupled to a clock input of a third flip-flop circuit 258. The second flip-flop circuit 254 further includes a data output coupled to a node 260. The node 260 is coupled to a second inverted input of the logic circuit 280 and to a summing node 262, which receives data from the feedback loop 278 and from the node 260 and which provides data to a data input of the third flip-flop circuit 258. The third flip-flop circuit 258 includes a clock output coupled to a clock input of a fourth flip-flop circuit 264.

Further, the third flip-flop circuit 258 includes a data output coupled to a node 266, which is coupled to a third inverted input of the logic circuit 280 to a data input of the fourth flip-flop circuit 264. The fourth flip-flop circuit 264 includes a clock output coupled to a clock input of a fifth flip-flop circuit 268 and includes a data output coupled to a summing node 270, which is coupled to the feedback loop 278 and which provides data to a data input of the fifth flip-flop circuit 268. The fifth flip-flop circuit 268 includes a data output coupled to a node 272 that is coupled to a fourth input of the logic circuit 280 and to a summing node 276, which receives an input from a multiplexing circuit 274 and which provides data to the feedback loop 278. The logic circuit 280 has an output coupled to a node 282, which in turn is coupled to the multiplexing circuit 274 and an output multiplexing circuit 290 that is part of the logic circuit 202. Further, the multiplexing circuit 274 is coupled to a data input 274. In a particular embodiment, the multiplexing circuit 274 is adapted to multiplex data at an output node 272 and the data input 274 based on an inverted version of the toggle signal 209 received via the toggle circuit 208.

The node 242 of the first syndrome generator 210 and the node 282 of the second syndrome generator 250 are coupled to the inputs of the multiplexing circuit 290, which provides an output to a summing node 292, which receives the $14^{th}$ bit from the data shifter line 296 and which provides the FEC decoder data at the output 296.

In a particular embodiment, when the toggle output 209 is a logic high low level, the inverter alters the toggle output logic level to a logic high level, which causes the multiplexer 284 to output a zero value, which is clocked into the flip-flop circuits 252, 254, 258, 264, and 268. At the same time, the toggle output 209 causes the multiplexer 234 to output the data input, which is clocked into the flip-flop circuits 212, 214, 218, 224, and 228. The first syndrome generator 210 produces an output that is provided to the logic circuit 240 to produce a corrected output at the output node 242, which is provided to the output multiplexing circuit 290 to provide the data value at the output node 242 to the FEC decoder output 296 via the summing node 292.

In a particular embodiment, the first syndrome generator 210 is active to receive input data 244 when the counter circuit 206 is counting from zero to 14, at which time the counter circuit 206 is reset, and the first syndrome generator 210 processes and outputs the corrected data to the output multiplexing circuit 290. When the counter circuit 206 resets, the second syndrome generator 250 is activated for the next fifteen clock cycles (i.e., from count zero to count 14). In a particular embodiment, the first and second syndrome generators 210 and 250 are coordinated to alternately receive fifteen bits of input data from a continuous bit stream. In each clock cycle, a single data bit is received and shifted into a flip-flop of one of the first syndrome generator 210 or the second syndrome generator 250. For example, after the fifteen bits of data are received at the first syndrome generator 210, the second syndrome generator 250 is activated to receive the next fifteen bits of data from the bit stream. The first and second syndrome generators 210 and 250 are alternately activated to receive the sampled bit data. During the next ten clock cycles, while the second syndrome generator 250 is receiving the first ten of the fifteen data bits, the first syndrome generator 210 corrects errors in the data bits and outputs the corrected data.

In a particular embodiment, the received bit stream is encoded using a forward error correction (FEC) technique, such as an expurgated Hamming code, which is a cyclic code. In a (15, 10) Hamming code, the 10-binary data symbols can be denoted by data symbols ($d=[d_0, d_1, \ldots, d_9]$) and the code symbols can be denoted by the code symbols ($c=[c_0, c_1, \ldots, c_{14}]$). If we associate the data symbols with a data message polynomial $d(x)=d_0+d_1x+\ldots+d_9x^9$ and associate c with the code polynomial $c(x)=c_0+c_1x+\ldots+c_{14}x^{14}$, the systematic encoding is described by the following equation:

$$c(x)=d(x)x^5-R_{g(x)}\{d(x)x^5\} \quad \text{(Equation 1)}$$

where $R_{g(x)}\{d(x)x^5\}$ represents the remainder when dividing $d(x)x^5$ by the generator polynomial $g(x)=1+x^2+x^4+x^5$. The binary code symbols $c_i$ are mapped to binary modulation symbols $\alpha_i \square \{\pm 1\}$, which can be Gaussian Frequency-Shift Keying (GFSK) modulated.

In a particular example, the expurgated (15,10) Hamming code allows for single error correction (SEC) and also provides that an additional sixteen error patterns with Hamming weight larger than one can also be corrected. In particular, double adjacent bit errors can also be corrected. The first and second syndrome generators 210 and 250 are error trapping decoders that check for a match with the syndrome for a single error according to the following equation:

$$s_1(x)=R_{g(x)}\{x^5 \cdot x^{14}\}=R_{g(x)}\{x^4\}=x^4 \quad \text{(Equation 2)}.$$

Further, the first and second syndrome generators 210 and 250 are adapted to check for a match with an error pattern for a double-adjacent error according to the following equation:

$$s_2(x)=R_{g(x)}\{x^5 \cdot (x^{13}+x^{14})\}=R_{g(x)}\{x^3+x^4\}=x^3+x^4 \quad \text{(Equation 3)}.$$

If the double-adjacent error ($s_2(x)$) of Equation 3 is detected, the syndrome generator (either the first or the second syndrome generator 210 or 250) corrects the first erroneous bit, and, due to syndrome update via the feedback lines 238 and 278, the single error correction syndrome ($s_1(x)$) is generated after the next cyclic shift. Thus, the first and second syndrome generators 210 and 250 can be used to perform single error correction and double adjacent error correction with no additional implementation complexity.

In a particular embodiment, the system 200 is adapted to correct data errors in a continuous bit stream, using forward error correction (FEC) information within the bit stream, without requiring a gap in the received data and without duplicating the entire FEC decoder circuit. Further, the system 200 can correct both single errors and double adjacent errors within the sampled bits without adding any processing complexity. It should be understood that the system 200 can include an initial conditions module, such as the initial conditions module 116, to reset the first and second syndrome generators 210 and 250. Additionally, the system 200 can include a stall circuit (such as the stall flag 122) that is adapted to provide a first indicator to a host system representing that data at an output of the system is valid and ready to be sampled or a second indicator at the output indicating that the data is corrupt. In the latter case, the system 200 may ignore the corrupted data (in an audio application, for example), request retransmission of the data, perform further error correction on the corrupted data, take another action, or any combination thereof.

Figure 3:
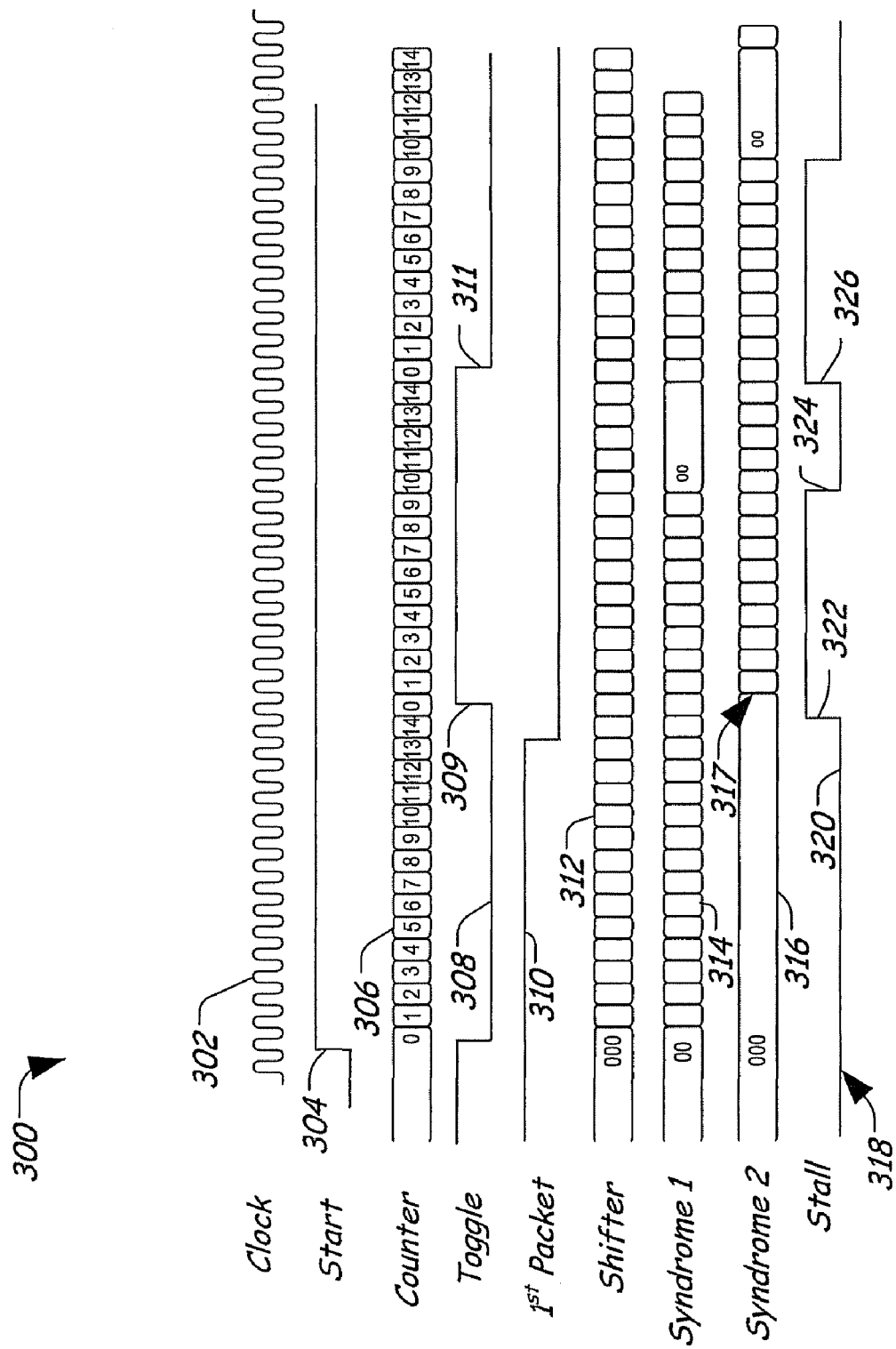
FIG. 3 is a particular illustrative embodiment of a timing diagram of the FEC decoders of FIGS. 1 and 2.

FIG. 3 is a particular illustrative embodiment of a timing diagram 300 of the FEC decoder 102 of FIG. 1 and of the system of FIG. 2. The timing diagram 300 illustrates a clock signal 302 that is a periodic waveform. A start signal 304 activates the FEC decoder at the second pulse of the clock signal 302 by increasing from a logic low level to a logic high level. At the same time, the toggle signal 308 transitions to a logic low state (which toggle occurs every other time the counter resets from fourteen back to zero), and the counter 306 at the next clock pulse begins counting from zero to 14. In a particular example, it should be understood that the toggle signal 308 transitions from one logic level to another logic level every time the counter circuit resets. In a particular example, the toggle signal 308 remains at a logic high level until the counter circuit resets, and then the toggle signal 308 switches to a logic low level. Further, the toggle signal 308 alternates each time the counter circuit resets.

The first packet of information 310 is received and shifted into the FEC shifter (as indicated by the shifter signal 312. The shifter signal 312 is represented by zeros until the start signal 304 is enabled, at which time the shifter signal 312 represents data bits associated with a first received packet 310. The first syndrome generator signal 314 is received by the first syndrome generator over the first fifteen clock cycles, shifting the data bits of the shifter signal into flip-flops associated with the first syndrome generator. When the toggle signal switches at 309, the FEC shifter signal 312 is directed to a second syndrome generator as indicated by a second syndrome generator signal 316. Until the toggle signal 308 switches to the logic high level at 309, the second syndrome generator signal 316 is represented by a sequence of zeros. As illustrated by the multiplexing circuits 234 and 274 and the associated discussion with respect to FIG. 2, the multiplexing circuits 234 and 274 provide zeros to the data inputs of the first flip-flop circuits 212 and 252, respectively, when the toggle signal 209 deactivates the multiplexing circuits 234 and 274.

When the toggle signal 308 switches at 309, sampled bits are clocked into the second syndrome generator for the next fifteen clock cycles as indicated by the second syndrome generator signal 316 and the data receiving transition indicated at 317. At the same time, the first syndrome generator outputs the ten corrected bits over the next ten clock cycles and then receives zeros for the remaining five. When the toggle signal switches back at 311, the first syndrome generator receives the first syndrome generator signal 314 corresponding to sampled data bits from the FEC shifter.

The timing diagram 300 further illustrates a stall signal 318 that is at a logic low level 320 until the first fifteen clock cycles of the clock signal 302 have expired. During the next ten clock cycles at 322, the stall signal 318 changes to a logic high level, which logic level can be recognized by a host system as an indication that the data values at the output of the FEC decoder have been error corrected and can be sampled. During the last five clock cycles while the second syndrome generator is receiving the bits, the stall signal 318 changes to a logic low level (at 324) and reverts back to a logic high level at 326 (for the next 10 clock cycles), when the error corrected data from the second syndrome generator is ready to be sampled.

In a particular embodiment, both ends of the FEC shifter circuit are utilized at the same time, as indicated by the FEC shifter signal 312, which continuously receives data bits. Control logic, such as an FEC counter with a toggle signal output 308 can be used to select which syndrome generator (first or second) receives the sampled bits for error decoding, and the stall flag can be used to notify the host system when the error corrected data is ready to be sampled by the host system. In an alternative embodiment, the stall flag signal 318 can be replaced with a register or with two signals to indicate when valid data is available and also to indicate when the error corrected data is corrupted. In this way, a continuous bit stream can be decoded without gaps in the received bits and without complete redundancy of two FEC decoder circuits. Instead, by duplicating the syndrome generator, sharing the FEC clock, and using logic to selectively utilize the first and second syndrome generators, a continuous bit stream can be decoded while using only thirty-two flip-flop circuits, which uses less circuit area than two FEC decoder circuits.

Figure 4:
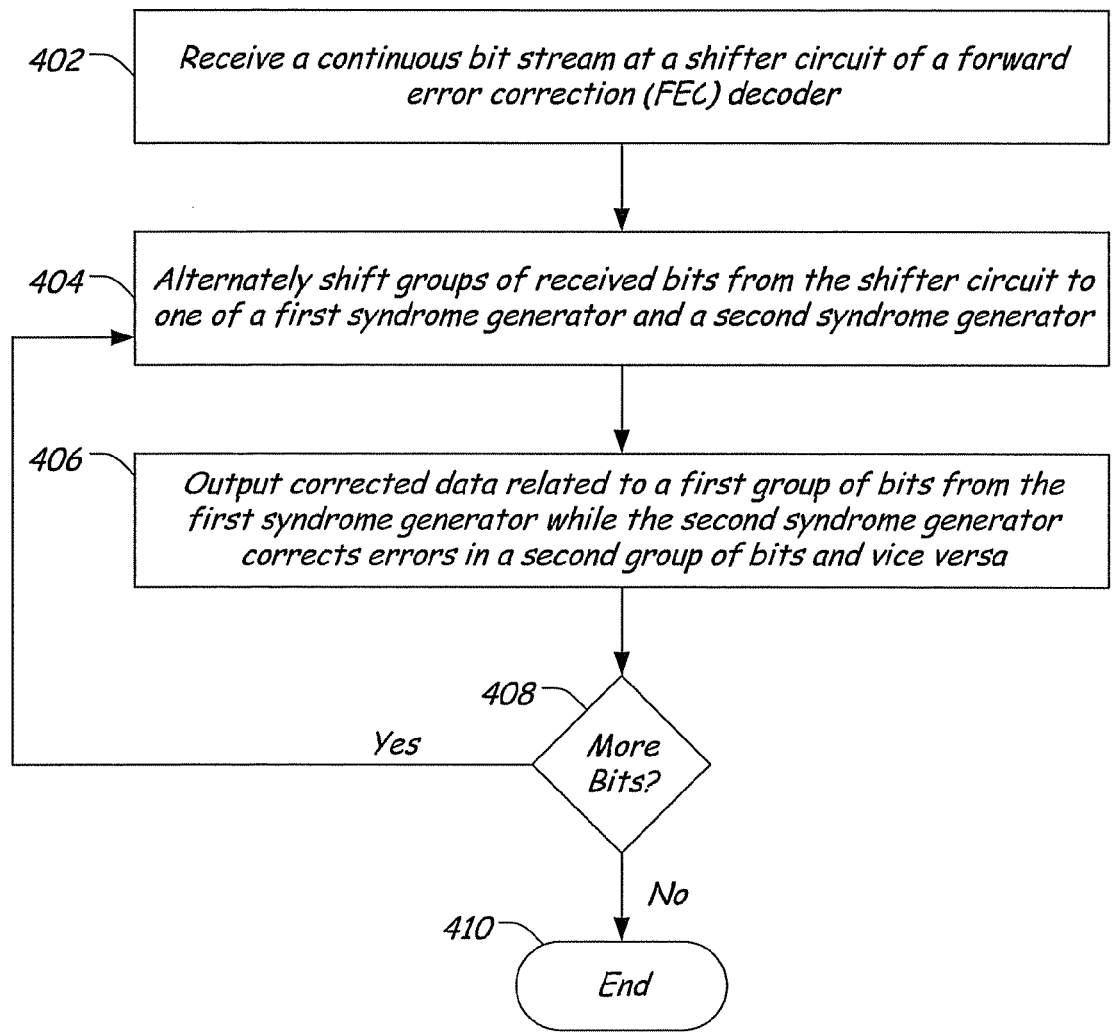
FIG. 4 is a flow diagram of a particular illustrative embodiment of a method of decoding a continuous bit stream using a pair of syndromes.

FIG. 4 is a flow diagram of a particular illustrative embodiment of a method of decoding a continuous bit stream using a pair of syndromes. At 402, a continuous bit stream is received at a shifter circuit of a forward error correction (FEC) decoder. Continuing to 404, groups of received bits are alternately shifted from the shifter circuit to one of a first syndrome generator or a second syndrome generator. In a particular example, the FEC shifter circuit shifts a first fifteen bits of the continuous bit stream into the first syndrome generator, shifts a second fifteen bits of the continuous bit stream into the second syndrome generator, and then shifts a third fifteen bits of the continuous bit stream into the first syndrome generator, and so on. In this particular example, the FEC decoder is adapted to alternately use the first and second syndrome generators to correct bit errors in a continuous bit stream using forward error correcting code, and particularly a (15,10) Hamming FEC code. In another embodiment that uses a different Hamming code or that uses a different FEC code, a different number of bits may be shifted at a given time. In a particular example, the first and second syndrome generators are adapted to correct both single bit errors and double-adjacent bit errors within the sampled bits.

Proceeding to 406, corrected data related to the first group of bits is output from the first syndrome generator while the second syndrome generator corrects errors in a second group of bits, and vice versa. In a particular example, the first syndrome generator receives bits while the second syndrome generator outputs bits, and vice versa. At 408, if there are more bits to be corrected, the method returns to 404 and a next group of bits are shifted from the shifter circuit to one of the first or second syndrome generator. If there are no more bits at 408, the method terminates at 410.

Figure 5:
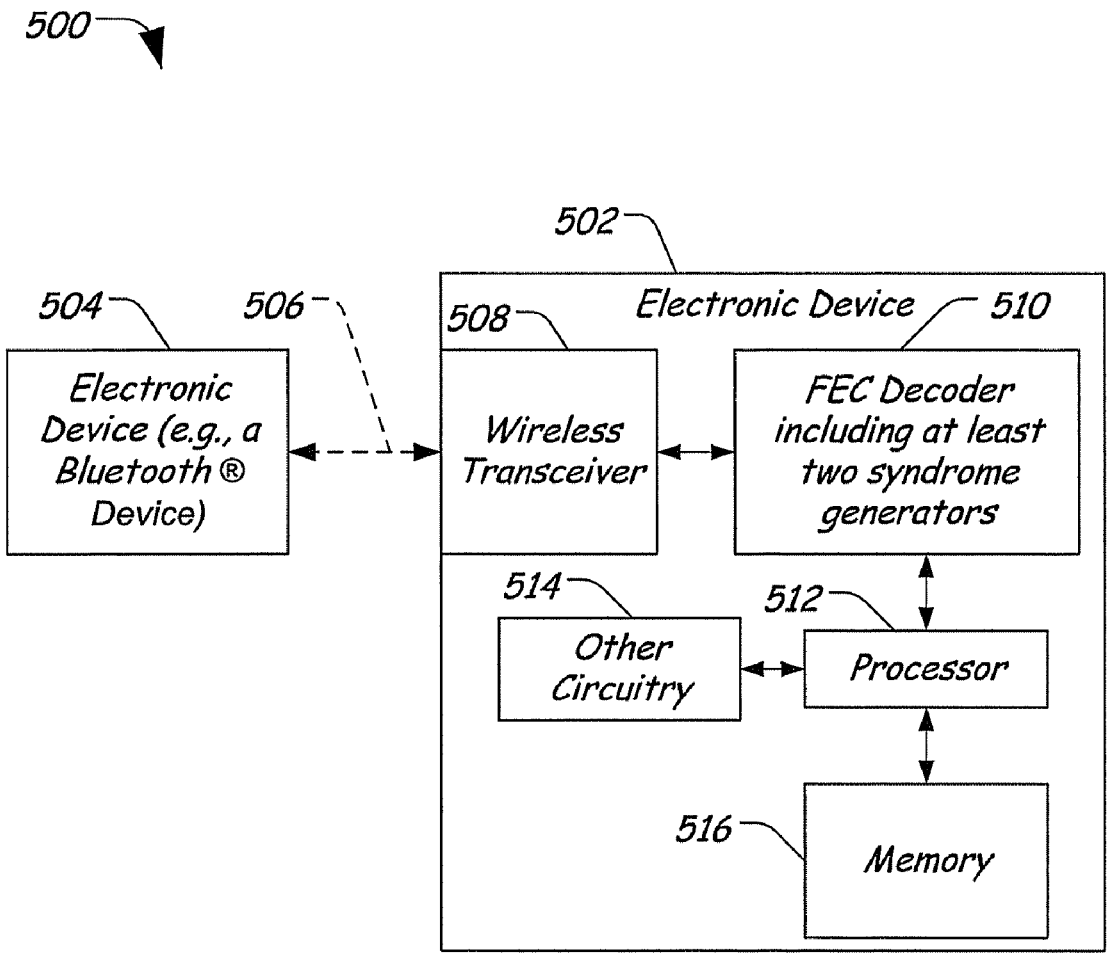
FIG. 5 is a block diagram of a particular illustrative embodiment of a system that includes an electronic device having an FEC decoder that includes at least two syndrome generators to decode a signal including FEC information.

FIG. 5 is a block diagram of a particular illustrative embodiment of a system 500 that includes an electronic device 502 having an FEC decoder 510 that includes at least two syndrome generators to decode a signal including FEC information. The system 500 includes the electronic device 502, which adapted to communicate with a second electronic device 504 via a wireless communication channel 506. In a particular embodiment, the electronic device 502 can be a portable device, such as a mobile telephone, a media (audio, video, text, or any combination thereof) player, another type of electronic device, or any combination thereof. Further, the second electronic device 504 can be an ear piece including a speaker, a microphone, or any combination thereof. In a particular example, the second electronic device 504 can be a headset that communicates with the electronic device 502 using a Bluetooth® communications protocol, another wireless protocol that uses forward error correction (FEC) information, or any combination thereof.

The electronic device 502 includes a wireless transceiver 508 that is adapted to send and receive data via the wireless communication channel 506. The wireless transceiver 508 is coupled to a forward error correction (FEC) decoder 510 that includes at least two syndrome generators that are adapted to correct single errors and double adjacent errors within received data payloads. The electronic device 502 further includes a processor 512 that is coupled to the FEC decoder 510 to receive corrected data. The processor 512 is coupled to other circuitry 514, such as display circuitry, microphone circuitry, speaker circuitry, other circuitry, or any combination thereof. The processor 512 is also coupled to a memory 516, which may store instructions that are executable by the processor 512.

It should be understood that the electronic device 502 can be a digital telephone, a personal digital assistant (PDA), another electronic device, or any combination thereof. In a particular example, the electronic device 502 can also include another wireless transceiver (not shown) that is adapted to communicate with a telephone network, such as a digital or cellular telephone network.

Further, while the above-discussion has been directed to Hamming codes, it should be understood that other types of serial data codes may be used that include forward error correction information. For example, other types of binary linear codes may be used. In another example, the received continuous bit stream can include Bose-Chaudhuri-Hocquenghem (BCH) codes, which are multilevel, cyclic, error-correcting, variable-length digital codes that can be used to correct multiple random error patterns. In a particular example, the first and second syndrome generators can be adapted to independently decode portions of the continuous bit stream using the BCH codes. Further, other types of forward error correction codes may also be used. In certain instances, such codes may require modification of the syndrome generators for the particular FEC coding process.

In conjunction with the circuit devices, systems and methods described above with respect to FIGS. 1-5, a forward error correcting (FEC) decoder is disclosed that is adapted to receive a continuous bit stream including FEC data bits and to alternately correct errors within the continuous bit stream using the FEC data bits via one of a first and a second syndrome generator. In a particular example, the FEC decoder receives sampled data related to a continuous bit stream and corrects portions with a first decoder while outputting error corrected data via the second portion. In this way, the FEC decoder can handle a bit stream without gaps in the received data.

Although the present disclosure has been described with reference to preferred embodiments, workers skilled in the art will recognize that changes may be made in form and detail without departing from the spirit and scope of the invention.

What is claimed is:

1. A forward error correction (FEC) decoder comprising:
an input responsive to a communication channel to receive sampled bits from a continuous bit stream;
a logic circuit to alternately provide sets of the received sampled bits from the continuous bit stream to one of a first syndrome generator and a second syndrome generator to correct errors in the sets of sampled bits to produce a decoded output related to the continuous bit stream.

2. The FEC decoder of claim 1, further comprising a data shifter circuit adapted to shift a number of bits corresponding to a particular forward error correction (FEC) code, wherein the data shifter circuit is responsive to the logic circuit to alternately shift the received number of bits to one of the first syndrome generator and the second syndrome generator.

3. The FEC decoder of claim 2, wherein the FEC code comprises a (15, 10) Hamming code, and wherein the data shifter circuit is adapted to shift fifteen data bits.

4. The FEC decoder of claim 1, wherein the continuous bit stream includes Bose-Chaudhuri-Hocquenghem (BCH) codes, and wherein the first and second syndrome generators are adapted to independently decode portions of the continuous bit stream using the BCH codes.

5. The FEC decoder of claim 1, wherein the first syndrome generator and the second syndrome generator are adapted to correct a single bit error and double adjacent bit errors within each set of sampled bits.

6. The FEC decoder of claim 1, further comprising selection logic adapted to alternately provide correction bits from one of the first syndrome generator or the second syndrome generator to correct data bits of the decoded output.

7. The FEC decoder of claim 6, further comprising a stall circuit adapted to notify a host system when data at the output is valid.

8. A circuit device comprising:
   a shifter circuit responsive to a communication channel to receive sampled bits related to a continuous bit stream and to shift the sampled bits serially with each clock cycle;
   a first syndrome generator to correct at least one error within a first set of sampled bits to produce a first set of correction bits;
   a second syndrome generator to correct at least one error within a second set of sampled bits to produce a second set of correction bits; and
   a logic circuit adapted to control the shifter circuit to selectively shift the sampled bits to one of the first syndrome generator and the second syndrome generator to control the shifter circuit to produce to a corrected output related to the continuous bit stream.

9. The circuit device of claim 8, wherein the logic circuit alternates between the first syndrome generator and the second syndrome generator periodically.

10. The circuit device of claim 9, wherein the first syndrome generator is adapted to receive the first set of bits when the second syndrome generator is outputting the second set of correction bits to produce the corrected output.

11. The circuit device of claim 8, further comprising:
   a first multiplexing circuit responsive to the logic circuit to selectively provide the sampled bits to the first syndrome generator;
   a second multiplexing circuit responsive to the logic circuit to selectively provide the sampled bits to the second syndrome generator; and
   an output multiplexing circuit responsive to the logic circuit to selectively provide the first or the second set of corrected bits to an output.

12. The circuit device of claim 11, wherein each of the first and second sets of sampled bits include a first number of data bits and a second number of error correcting bits.

13. The circuit device of claim 8, wherein the logic circuit comprises:
   a counter circuit to count a number of clock cycles; and
   a toggle circuit coupled to the counter circuit and adapted to trigger a switch between the first and second syndrome generators when the number of clock cycles reaches a pre-determined number.

14. The circuit device of claim 8, wherein the logic circuit further comprises a stall mechanism adapted to notify a host system when the corrected output is available at an output terminal.

15. The circuit device of claim 14, where the stall mechanism comprises a register to indicate when corrected output includes valid data and to indicate when the data is corrupted.

16. A circuit device comprising:
   a first syndrome to generate first correction bits;
   a second syndrome to generate second correction bits;
   an forward error correcting (FEC) shifter circuit responsive to a communication channel to receive sampled bits from a continuous bit stream, the continuous bit stream comprising forward error correction (FEC) data;
   a counter circuit to count clock cycles and to reset after a pre-determined number of clock cycles; and
   a logic circuit to control the FEC shifter circuit to shift the sampled bits serially with each clock cycle, the logic circuit to alternate shifting the sampled bits to one of the first syndrome generator and the second syndrome generator when the counter circuit resets;
   wherein the first and second syndrome generators are adapted to use the FEC data to correct errors in the sampled bits and to generate, respectively, the first and second correction bits to produce a corrected output related to the continuous bit stream.

17. The circuit device of claim 16, wherein the sampled data comprises a (15, 10) Hamming code including a data payload of fifteen bits with five error correction bits.

18. The circuit device of claim 17, wherein the decoded output comprises ten error corrected bits for each data payload of fifteen bits.

19. The circuit device of claim 16, further comprising:
   a toggle circuit coupled to the counter circuit and adapted to produce a toggle output that changes each time the counter circuit is reset, the toggle output coupled to the FEC shifter circuit to control shifting of the sampled bits to one of the first syndrome generator or the second syndrome generator based on a value of the toggle output.

20. The circuit device of claim 19, wherein the logic circuit further comprises an initial conditions module to configure initial conditions of the first and second syndrome generators and the toggle circuit.

21. The circuit device of claim 16, wherein the logic circuit further comprises a stall circuit to notify a host system when the corrected output is available for sampling and to notify the host system when the corrected output is corrupt.

* * * * *